United States Patent
Høyerby

(10) Patent No.: US 10,686,416 B2
(45) Date of Patent: Jun. 16, 2020

(54) MULTI-LEVEL CLASS D AUDIO POWER AMPLIFIERS

(71) Applicant: Infineon Technologies Austria AG, Villach (AT)

(72) Inventor: Mikkel Høyerby, Copenhagen (DK)

(73) Assignee: Infineon Technologies Austria AG, Viilach (AT)

( * ) Notice: Subject to any disclaimer, the term of this patent is extended or adjusted under 35 U.S.C. 154(b) by 0 days.

(21) Appl. No.: 16/376,723

(22) Filed: Apr. 5, 2019

(65) Prior Publication Data
US 2019/0238107 A1    Aug. 1, 2019

Related U.S. Application Data

(63) Continuation of application No. 15/537,919, filed as application No. PCT/EP2015/081281 on Dec. 28, 2015, now Pat. No. 10,284,155.

(30) Foreign Application Priority Data

Dec. 30, 2014  (EP) ..................................... 14200658
Aug. 4, 2015   (EP) ..................................... 15179722

(51) Int. Cl.
  *H03F 3/217*    (2006.01)
  *H03F 1/02*     (2006.01)

(52) U.S. Cl.
  CPC ......... *H03F 3/2173* (2013.01); *H03F 1/0277* (2013.01); *H03F 3/2178* (2013.01); *H03F 2200/03* (2013.01)

(58) Field of Classification Search
  CPC .... H03F 3/2173; H03F 3/2178; H03F 1/0277; H03F 2200/03; H03F 3/217; H03F 3/2171

(Continued)

(56) References Cited

U.S. PATENT DOCUMENTS 5,715,153 A    2/1998  Lu
6,756,772 B2   6/2004  McGinnis
                (Continued)

FOREIGN PATENT DOCUMENTS

CN   101127509 A    2/2008
CN   101569091 A   10/2009
                (Continued)

OTHER PUBLICATIONS

Dancy, Abram, et al., "A Reconfigurable Dual Output Low Power Digital PWM Power Converter", 1998 International Symposium on Low Power Electronics and Design Proceedings, Aug. 10-12, 1998.

*Primary Examiner* — Khanh V Nguyen
(74) *Attorney, Agent, or Firm* — Murphy, Bilak & Homiller, PLLC

(57) ABSTRACT

The present invention relates to a multi-level class D audio power amplifier for supplying an N-level drive signal to a loudspeaker. The multi-level class D audio power amplifier further comprises a switching matrix comprising a plurality of controllable semiconductor switches where the switching matrix comprising at least (N−2) switch inputs, coupled to respective ones of (N−2) DC input voltage nodes, and at least 2*(N−2) switch outputs coupled to respective ones of 2*(N−2) intermediate nodes of a first output driver. A control circuit is configured to sequentially connect each of the (N−2) DC input voltages to a predetermined set of nodes of the 2*(N−2) intermediate nodes of the first output driver via the switching matrix in accordance with one or more of the 2*(N−1) modulated control signals of the first output driver. N is a positive integer larger than or equal to 3.

15 Claims, 9 Drawing Sheets

(58) Field of Classification Search
USPC .......................................................... 330/251
See application file for complete search history.

(56) References Cited

U.S. PATENT DOCUMENTS

| | | |
|---|---|---|
| 7,061,214 B2 | 6/2006 | Mayega et al. |
| 7,190,225 B2 | 3/2007 | Edwards |
| 7,224,085 B2 | 5/2007 | Chen et al. |
| 7,319,763 B2 | 1/2008 | Bank et al. |
| 7,626,445 B2 | 12/2009 | Lesso et al. |
| 7,786,712 B2 | 8/2010 | Williams |
| 8,044,719 B2 | 10/2011 | Norimatsu et al. |
| 8,049,561 B2 | 11/2011 | Buter et al. |
| 8,289,082 B2 | 10/2012 | Prohaska et al. |
| 8,466,743 B2 | 6/2013 | Jiang et al. |
| 8,643,436 B2 | 2/2014 | Ni et al. |
| 9,007,042 B2 | 4/2015 | Okuda et al. |
| 9,602,020 B2 | 3/2017 | Kondo et al. |
| 2004/0047477 A1 | 3/2004 | Bank et al. |
| 2007/0001735 A1* | 1/2007 | Muhlbacher ............ H03F 3/217 327/218 |
| 2010/0090764 A1 | 4/2010 | Buter et al. |
| 2010/0231298 A1 | 9/2010 | Norimatsu et al. |
| 2012/0049930 A1 | 3/2012 | Han |
| 2013/0127530 A1 | 5/2013 | Ni et al. |
| 2013/0285744 A1 | 10/2013 | Fei et al. |
| 2014/0043010 A1 | 2/2014 | Salem |
| 2014/0300413 A1 | 10/2014 | Høyerby et al. |
| 2017/0324321 A1 | 11/2017 | Høyerby |

FOREIGN PATENT DOCUMENTS

| | | |
|---|---|---|
| CN | 101989842 A | 3/2011 |
| EP | 2544344 A1 | 1/2013 |
| GB | 2475633 A | 5/2011 |
| JP | 2002062858 A | 2/2002 |
| WO | 2012055968 A1 | 5/2012 |
| WO | 2016050645 A1 | 4/2016 |

* cited by examiner

MULTI-LEVEL CLASS D AUDIO POWER AMPLIFIERS

The present invention relates to a multi-level class D audio power amplifier for supplying an N-level drive signal to a loudspeaker. The multi-level class D audio power amplifier further comprises a switching matrix comprising a plurality of controllable semiconductor switches where the switching matrix comprises at least (N−2) switch inputs, coupled to respective ones of (N−2) DC input voltage nodes, and at least 2*(N−2) switch outputs coupled to respective ones of 2*(N−2) intermediate nodes of a first output driver. A control circuit is configured to sequentially connect each of the (N−2) DC input voltages to a predetermined set of nodes of the 2*(N−2) intermediate nodes of the first output driver via the switching matrix in accordance with one or more of the 2*(N−1) modulated control signals of the first output driver. N is a positive integer larger than or equal to 3.

BACKGROUND OF THE INVENTION

Class D audio amplifiers are well-known and widely recognized to provide energy efficient audio drive of various types of loudspeakers by switching a pulse width modulated (PWM) or pulse density modulated (PDM) signal across the loudspeaker load. Class D audio amplifiers typically comprise an H-bridge output stage coupled to the loudspeaker load to apply a pair of oppositely phased or complementary pulse width modulated audio signals across the loudspeaker. An inductor-capacitor (LC) lowpass filter is often inserted between the H-bridge based output stage and the loudspeaker load to suppress carrier wave components of the PWM or PDM output signal. Several types of pulse width modulation have been utilized in prior art class D audio amplifiers. In so-called AD modulation, the pulse width modulated audio signal at each output terminal or node of the H-bridge output stage is switched, or toggled, between two different voltage levels in opposite phase. The two different levels typically correspond to the upper and lower power supply rails, respectively, such as the positive and negative DC supply rails of the class D audio amplifier. In so-called BD modulation, the pulse width modulated signal across the loudspeaker load is alternatingly switched between three voltage levels, of which two levels correspond to the above-mentioned upper and lower DC power supply rails while the third voltage level is a zero level that is obtained by simultaneously pulling both sides of the loudspeaker load to one of the DC power supply rails. Both of these modulation schemes generate rather large ripple current in the output inductor of the LC lowpass filter when the class D amplifier is idling, which causes significant power losses. This disadvantage has typically been tolerated and controlled to a certain extent by use of relatively large inductors of the LC lowpass filter. However, such large inductors lead to significant increase of costs and size of the class D amplification solution or assembly.

So-called multi-level PWM modulation is an advantageous form of pulse width modulation of class D audio amplifiers and possesses numerous benefits over traditional AD and BD modulation, as described in detail by the applicant's PCT publication WO 2012/055968. This kind of multi-level PWM modulation typically involves various types of circuitry to generate one or more intermediate DC supply voltages, for example a mid-supply voltage level, situated between positive and negative DC supply rails or voltages of the class D audio amplifier in question. The one or more intermediate DC supply voltages is/are a low impedance source of a third voltage level, and further voltage levels, of the PWM drive signal applied to the loudspeaker for sound reproduction. An output driver or power stage of the multi-level class D audio amplifier comprises at least four series connected or cascaded controllable semiconductor switches, for example MOSFETs, with at least two intermediate circuit nodes situated where a pair of the controllable semiconductor switches are interconnected. The one or more intermediate DC supply voltages must be sequentially connected and disconnected to at least some of these intermediate circuit nodes to accurately produce the desired multi-level PWM output signal. Accordingly, there is a need in the art for effective control circuitry for sequentially connecting and disconnecting the one or more intermediate DC supply voltages to one or more intermediate circuit nodes of the output driver or power stage of the multi-level class D audio amplifier.

SUMMARY OF THE INVENTION

A first aspect of the invention relates to a multi-level class D audio power amplifier for supplying an N-level drive signal to a loudspeaker. The multi-level class D audio power amplifier comprises:
  a first output driver comprising at least 2*(N−1) controllable semiconductor switches coupled in series between a first DC supply rail and a second DC supply rail, wherein control terminals of the at least 2*(N−1) controllable semiconductor switches are connectable to respective ones of at least 2*(N−1) modulated control signals,
  2*(N−2) intermediate nodes interposed between the series connected 2*(N−1) semiconductor switches,
  a driver output node or terminal arranged at a midpoint of the series connected 2*(N−1) controllable semiconductor switches and connectable to a first input of the loudspeaker,
  (N−2) DC input voltage nodes for receipt of (N−2) DC input voltages,
  a switching matrix comprising a plurality of controllable semiconductor switches, the switching matrix comprising at least (N−2) switch inputs, coupled to respective ones of the (N−2) DC input voltage nodes, and at least 2*(N−2) switch outputs coupled to respective ones of the 2*(N−2) intermediate nodes of the first output driver,
  a control circuit configured to sequentially connect each of the (N−2) DC input voltages to a predetermined set of nodes of the 2*(N−2) intermediate nodes of the first output driver via the switching matrix in accordance with one or more of the 2*(N−1) modulated control signals of the first output driver;
  N being a positive integer equal to 3 or larger, i.e., N>=3.

Exemplary embodiments of the present multi-level class D audio power amplifier possess values of N=3, N=4 and N=5. The first output driver accordingly comprises at least 4, 6 and 8 cascaded or series coupled controllable semiconductor switches for N=3, 4 and 5, respectively, as disclosed in detail below with reference to the appended drawings. Each of the at least 2*(N−1) controllable semiconductor switches of the first output driver may comprise a MOSFET power transistor such as a PMOS, NMOS or LDMOS power transistor. In some embodiments, one-half of the at least 2*(N−1) controllable semiconductor switches may be arranged in an upper leg of the first output driver and each comprises a PMOS power transistor to simplify gate drive circuitry for the gate terminals of the PMOS power transistors. The residual one-half of the at least 2*(N−1) controllable semiconductor switches may be arranged in a lower leg of the first output driver and each comprises an NMOS power transistor. However, all of the at least 2*(N−1) controllable semiconductor switches may in alternative embodiments be NMOS power transistors.

Since the switching matrix is based on controllable semiconductor switches, the switching matrix is capable of providing bi-directional electrically conducting paths with relatively low-resistance or impedance between each of the (N−2) DC input voltages and each node of the predetermined set of nodes of the 2*(N−2) intermediate nodes of the first output driver. The bi-directional electrically conducting path may comprise one or more series coupled controllable semiconductor switches in conducting state or on states. Hence, when a particular intermediate node of the first output driver is connected to a particular input voltage of the (N−2) DC input voltages a relatively small series resistance or impedance may be added to the particular DC input voltage. The relatively small series resistance or impedance allows an accurate setting of the output voltage level at the loudspeaker through the driver output node. Furthermore, a disconnection of the particular intermediate node of the first output driver from a particular input voltage of the (N−2) DC input voltages is achieved in a very effective manner, because of the typical high impedance of the controllable semiconductor switches of the switching matrix in their non-conducting states or off states. In some embodiments of the present multi-level class D audio power amplifier, the switching matrix uses a single controllable semiconductor switch between a switch input and a switch output, while other embodiments use a more complex network with several controllable semiconductor switches between a switch input and a switch output, as disclosed in detail below with reference to the appended drawings. The skilled person will understand that each of the plurality of controllable semiconductor switches of the switching matrix may comprise a MOSFET transistor, for example an NMOS or PMOS transistor, which possesses a high impedance in a non-conducting state and a low, largely symmetrical, impedance in the conducting state. One or more of the plurality of controllable semiconductor switches of the switching matrix may comprise a LDMOS transistor.

One embodiment of the present multi-level class D audio power amplifier comprises an integral power supply for generating DC voltage for the positive DC supply rail and at least the (N−2) DC input voltages, although other embodiments may utilize power supply voltages generated by external power supply circuitry. According to the former embodiment, the multi-level class D audio power amplifier comprises a multiple output DC-DC power converter configured for generating at least the (N−2) DC input voltages at the (N−2) DC input voltage nodes of the switching matrix. The multiple output DC-DC power converter may be configured to generate the (N−2) DC input voltages with substantially equal voltage spacing, for example by scaling a voltage level of the first DC supply rail coupled to the first output driver with scaling factors: (n−2)/[N−1] for n=3 to N. The multiple output DC-DC power converter may comprise one of the multiple output DC-DC power converter circuits disclosed in the applicant's co-pending European patent application No. 14187490.9. Hence, the latter multiple output DC-DC power converter circuits may be conveniently configured to generate a plurality of substantially equally spaced DC output voltages for connection to the positive DC supply rail and to the (N−2) DC input voltage nodes, respectively, of the present multi-level class D audio power amplifier. The multiple output DC-DC converter may be configured to generate a maximum DC voltage in the range 1-30 V, such as between 2-20 V or more preferably between 1-10 V. The maximum DC voltage may be applied to a positive DC supply rail of the present multi-level class D audio power amplifier. The multiple output DC-DC power converter circuit may, for example, be configured to generate DC output voltages of 10 V and 5 V, or 10 V, 6.67 V, 3.33 V, etc., where 10 V corresponds to the maximum DC voltage depending on specific application requirements and the value of N, with high energy conversion efficiency using a small number of separate components.

The control circuit of the multi-level class D audio power amplifier may comprise a multi-phase pulse-width modulator configured to generate the at least 2*(N−1) modulated control signals for the control terminals of the at least 2*(N−1) controllable semiconductor switches of the first output driver. The multi-phase pulse-width modulator may be configured to generate at least (N−1) individual phases of a pulse-width modulated control signal. The at least (N−1) individual phases of the pulse-width modulated control signal may be used to derive appropriate modulated control signals for the respective control terminals of the at least 2*(N−1) controllable semiconductor switches of the first output driver. The multi-phase pulse-width modulator may, for example, be configured to generate 2, 3 or 4 individual phases of a pulse-width modulated control signal where two individual phases may be relatively phase shifted by substantially 180 degrees, three individual phases may be relatively phase shifted by substantially 120 degrees and four individual phases may be relatively shifted by substantially 90 degrees and so forth for even higher numbers of individual phases. The control circuit may further be configured to generate pulse-width modulated control signals for respective controls terminals of the plurality of controllable semiconductor switches of the switching matrix. The pulse-width modulated control signals for the semiconductor switches of the switching matrix may be derived in a relatively simple manner from the modulated control signals of the at least 2*(N−1) controllable semiconductor switches of the first output driver, as disclosed in detail below with reference to the appended drawings.

The multi-phase pulse-width modulator of the control circuit may comprise two or more comparators each having a first input coupled to an audio signal for the multi-level class D audio power amplifier and a second input coupled to a triangular or saw tooth wave generator for production of at least two individual phases of the pulse-width modulated control signals at the comparator outputs. The control circuit may comprise various types of inverters and digital logic to produce phase inverted replica of one or more of the pulse-width modulated control signals. A frequency of the triangular or saw tooth signals generated by these wave generators sets the modulation or carrier frequency of the multi-level class D audio power amplifier. The frequency of the triangular or saw tooth signals may, for example, be situated between 100 kHz and 1 MHz.

The multi-level class D audio power amplifier may comprise an H-bridge, or differential/BTL, output driver topology to supply a differential drive signal across first and second inputs of the loudspeaker, e.g., across a voice coil of the loudspeaker. According to this embodiment, the multi-level class D audio power amplifier comprises a second output driver which may be substantially identical to the first output driver and a second switching matrix. The multi-level class D audio amplifier with an H-bridge, or differential/BTL, output driver may therefore further comprise a second output driver comprising:

- at least 2*(N−1) controllable semiconductor switches coupled in series between the first DC supply rail and the second DC supply rail, wherein control terminals of the at least 2*(N−1) controllable semiconductor switches are connectable to respective ones of at least 2*(N−1) modulated control signals,
- 2*(N−2) intermediate nodes interposed between the series connected 2*(N−1) controllable semiconductor switches of the second output driver,
- a second driver output node or terminal arranged at a midpoint of the series connected 2*(N−1) controllable semiconductor switches and connectable to a second input of the loudspeaker,
- a second switching matrix comprising a plurality of controllable semiconductor switches, the switching matrix comprising at least (N−2) switch inputs, coupled to respective ones of the (N−2) DC input voltage nodes and at least 2*(N−2) switch outputs coupled to respective ones of the 2*(N−2) intermediate nodes of the second output driver;
  - wherein each of the at least 2*(N−1) modulated control signals of the second output driver is phase inverted relative to the corresponding modulated control signal of the first output driver.

An exemplary embodiment of the multi-level class D audio power amplifier, wherein N=3, may comprise a first output driver which comprises at least a first, a second, a third and a fourth controllable semiconductor switch coupled in series between the first DC supply rail and the second DC supply rail. Respective control terminals of the first, second, third and fourth controllable semiconductor switches are connectable to, or connected to, respective ones of the at least 4 modulated control signals. The first output driver comprises a first intermediate node arranged in-between the first and second series connected controllable semiconductor switches and a second intermediate node arranged in-between the third and fourth series connected controllable semiconductor switches. The switching matrix may comprise a fifth controllable semiconductor switch comprising a switch input coupled to a first DC input voltage node and a switch output coupled to the first intermediate node of the first output driver, and a sixth controllable semiconductor switch comprising a switch input coupled to the first DC input voltage node and a switch output coupled to the second intermediate node of the first output driver. The control circuit is configured to sequentially connect the first DC input voltage to the first intermediate node in accordance with a modulated control signal of the fifth controllable semiconductor switch and sequentially connect the first DC input voltage to the second intermediate node in accordance with a modulated control signal of the sixth controllable semiconductor switch, wherein the modulated control signals of the fifth and sixth controllable semiconductor switches are substantially phase inverted.

The skilled person will understand that the at least 2*(N−1) controllable semiconductor switches of the first output driver and the plurality of controllable semiconductor switches of the switching matrix, and optionally the control circuit and the second output driver, may be monolithically integrated, for example, on a silicon semiconductor substrate. This provides a low-cost and compact embodiment of the present multi-level class D audio power amplifier.

BRIEF DESCRIPTION OF THE FIGURES

Various embodiments of the invention are described below in further detail in connection with the appended drawings in which.

DESCRIPTION OF PREFERRED EMBODIMENTS

Figure 1:
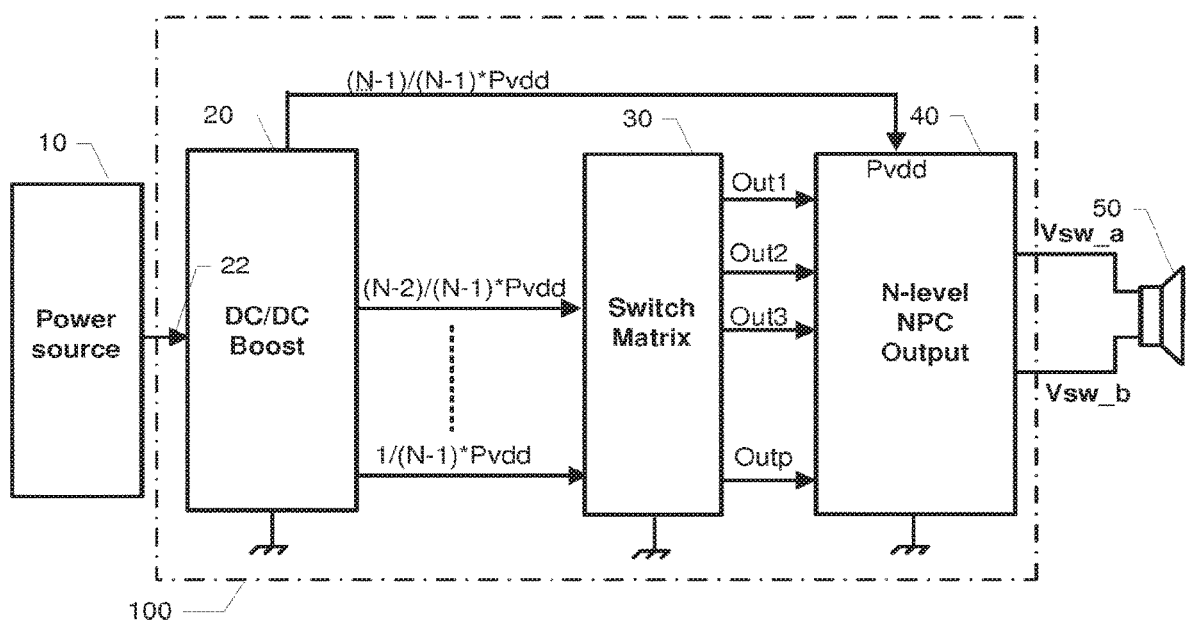
FIG. 1 is a simplified block diagram of multi-level class D audio power amplifiers for supplying N-level drive signals to a loudspeaker in accordance with the present invention.

FIG. 1 shows a top-level block diagram of multi-level class D audio power amplifiers 100 for supplying N-level drive signals to a loudspeaker 50 in accordance with preferred embodiments of the present invention. The multi-level class D audio power amplifier comprises an H-bridge, or differential, output providing first and second complementary N-level drive signals, Vsw_a and Vsw_b, to first and second terminals of the loudspeaker to supply audio drive current and voltage to the voice coil of the loudspeaker. Other embodiments of the multi-level class D audio power amplifier may comprise a single-ended output providing an N-level drive signal to one terminal of the loudspeaker while providing a mid-supply DC reference voltage to the other loudspeaker terminal, as discussed in additional detail below. N is a positive integer larger than or equal to 3 such that multi-level class D audio power amplifiers in accordance with the present invention may be configured for supplying 3, 4, 5 and even more levels of the drive signal to a loudspeaker.

The multi-level class D audio power 100 comprises a power stage or output circuit 40 which may comprise a first output driver, and optionally a second output driver, having the first and second outputs Vsw_a and Vsw_b coupled to the loudspeaker 50 as mentioned above. A drive voltage across the loudspeaker 50 comprises N-levels where N is a positive integer>=3. The first output driver may comprise at least 2*(N−1) controllable semiconductor switches coupled in series between a positive DC supply rail, Pvdd, and a negative DC supply rail, for example a ground potential of the audio power amplifier 100 (as indicated). Control terminals (not shown) of the at least 2*(N−1) controllable semiconductor switches are connected to respective ones of at least 2*(N−1) modulated control signals as discussed in further detail below. The multi-level class D audio power 100 comprises a switching matrix 30 which comprises a plurality of controllable semiconductor switches (not shown), such as MOSFET transistors, controlled by their respective control voltages at the respective gate terminals. The switching matrix 30 may comprise at least (N−2) switch inputs, coupled to respective ones of the (N−2) DC input voltage nodes—here illustrated by line (N−2)/(N−1)*Pvdd and line 1/(N−1)*Pvdd, etc. Consequently, the multiple output DC-DC power converter 20 is configured to generate (N−2) substantially equally spaced DC input voltages for coupling to respective ones of the (N−2) switch inputs of the switching matrix 30. This voltage scaling is carried out by dividing or scaling the upper or first DC supply voltage, Pvdd, with scaling factors: (n−2)/[N−1] for n=3 to N. N may for example be 3, 4, 5 or 6 to form a number of attractive embodiments of the present multi-level class D audio power amplifier 100 as discussed in further detail below. The switching matrix 30 comprises at least 2*(N−2) switch outputs, Out1, Out2, Out3, Outp, etc. coupled to respective ones of the 2*(N−2) intermediate nodes of the first output driver. The switching matrix 30 may comprise a switching matrix control circuit (not shown) that determines how and when the (N−2) switch inputs of the switching matrix 30, and hence the corresponding (N−2) DC input voltages, are coupled to the 2*(N−2) intermediate nodes of the first output driver via the at least 2*(N−2) switch outputs. The switching matrix control circuit is configured to sequentially connect each of the (N−2) DC input voltages to a predetermined set of nodes of the 2*(N−2) intermediate nodes of the first output driver via the switching matrix 30 in accordance with one or more of the 2*(N−1) modulated control signals of the first output driver. The predetermined set of intermediate nodes of the first output driver to which each DC input voltage is connected varies depending on the voltage level of the DC input voltage in question and depending on N, as described below in additional detail with reference to the node switching summary on FIG. 2.

A power source 10 may supply operational power and voltage to the multi-level class D audio power 100 by feeding an input 22 of the multiple output DC-DC power converter 20 with a suitable DC supply voltage. The power source 10 may comprise rechargeable batteries and/or a mains connected power supply circuit, for example an AC/DC switch mode power supply. The multiple output DC-DC power converter 20 may comprise one of the multiple output DC-DC power converter circuits disclosed in the applicant's co-pending European patent application No. 14187490.9. The latter multiple output DC-DC power converter circuits may conveniently be configured to generate a plurality of substantially equally spaced DC output voltages, for example 10 V, 5 V and OV, or 10 V, 6.67 V, and 3.33 V, etc. with high energy conversion efficiency using a small number of separate components.

Figure 2:
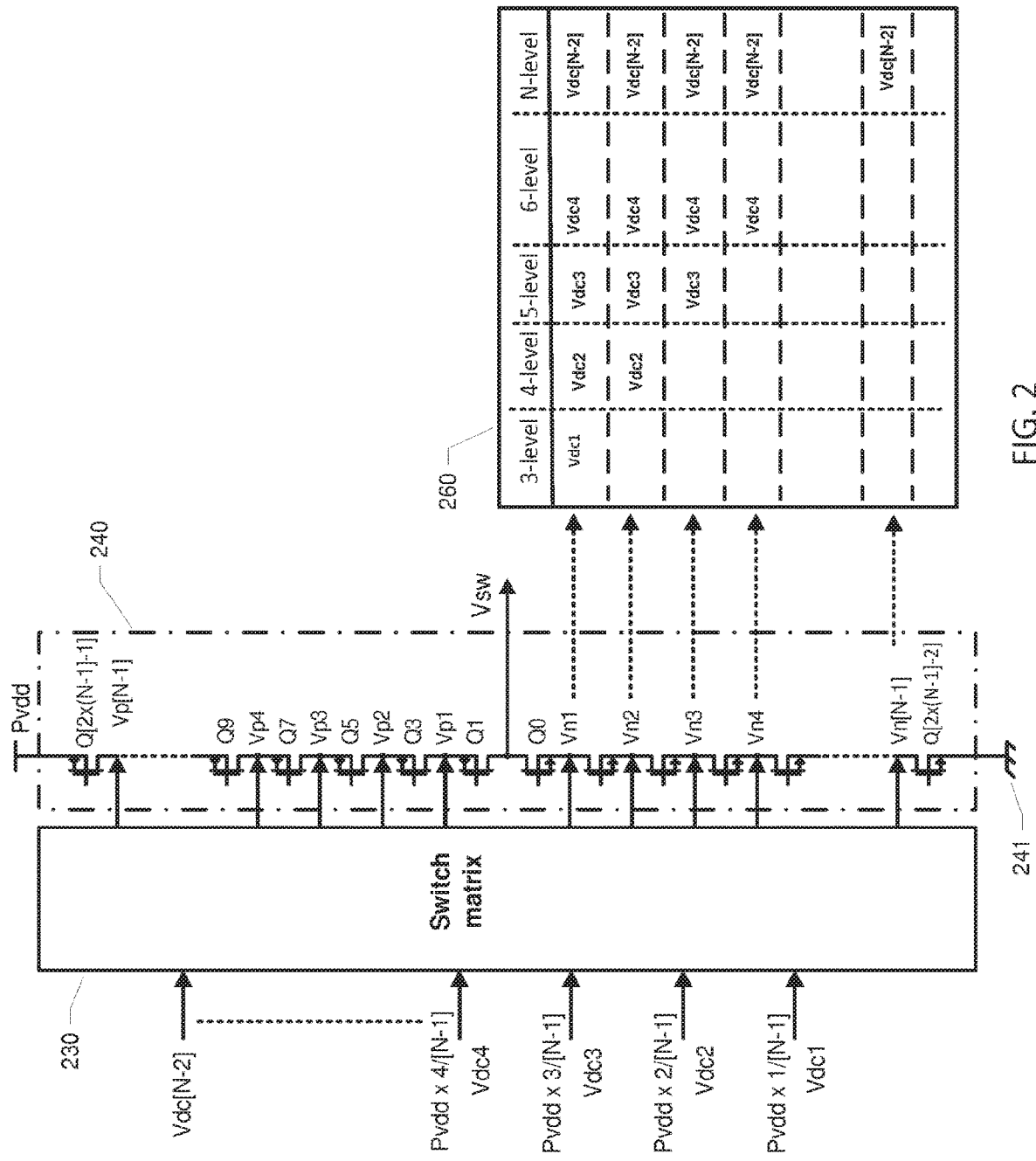
FIG. 2 shows a simplified circuit diagram of a first output driver and switching matrix of multi-level class D audio power amplifiers in accordance with the invention.

FIG. 2 shows a simplified circuit diagram of the above discussed first output driver 240 of the power stage 40 coupled to an exemplary switching matrix 230. The first output driver 240 comprises 2*(N−1) controllable semiconductor switches Q[2*(N−1)−1] to Q[2*(N−1)−2] coupled in series or cascade between a positive DC supply rail Pvdd and a ground potential or ground node 241. The gate inputs or terminals of the 2*(N−1) controllable semiconductor switches Q[2*(N−1)−1] to Q[2*(N−1)−2] are connected to respective ones of at least 2*(N−1) modulated control signals as explained in further detail below with reference to an exemplary 3-level pulse-width modulated class D audio power 300. The skilled person will understand that each of the 2*(N−1) controllable semiconductor switches Q[2*(N−1)−1] to Q[2*(N−1)−2] may comprise a power transistor such as a IGBT or FET power transistor, for example a MOSFET power transistor such as a PMOS, NMOS or DMOS power transistor. In one embodiment of the first output driver 240, each of the controllable semiconductor switches Q[2*(N−1)−1] to Q[2*(N−1)−2] comprises an NMOS transistor due to the low on-resistance for a given size of the transistor. The positive DC supply rail Pvdd may possess a level between 1 V and 30 V. The first output driver 240 comprises 2*(N−2) intermediate nodes Vp[N−1]–Vn[N−1] interposed between the series connected 2*(N−1) semiconductor switches or power transistors [2*(N−1)−1] to Q[2*(N−1)−2]. The first output driver 240 additionally comprises a driver output node or terminal Vsw arranged at a midpoint of the series connected 2*(N−1) semiconductor switches, e.g., at the interconnected drain nodes of the innermost power transistors Q1 and Q0. The driver output terminal Vsw delivers the previously discussed N-level output signal to the loudspeaker to supply audio drive current and voltage to the voice coil of the loudspeaker. The multi-level class D audio power may comprise a lowpass filter connected between the driver output terminal Vsw and the input terminal of the loudspeaker to remove or suppress carrier signal components of the N-level output signal and thereby protect the loudspeaker against excessive levels of potentially harmful ultrasonic signals. The 2*(N−2) intermediate nodes Vp[N−1]–Vn[N−1] of the first output driver 240 are connected to respective ones of the 2*(N−2) switch outputs of the switching matrix 230 such that the DC voltage of each intermediate node can be temporarily set to a particular DC input voltage available at a particular input of the switching matrix 230. The switching matrix 230 comprises at least (N−2) switch inputs connected to respective ones of (N−2) equally spaced DC-input voltages Vdc1, Vdc2, Vdc3, Vdc4, Vdc(N−2) as discussed above. As discussed above, the switching matrix control circuit (not shown) is configured to sequentially connect each of the (N−2) DC input voltages to a predetermined set of nodes of the 2*(N−2) intermediate nodes Vp[N−1]–Vn[N−1] of the first output driver 240 via the switching matrix 230 in accordance with one or more of the 2*(N−1) modulated control signals of the first output driver. The table 260 indicates for each value of N and each of the intermediate nodes Vn1, Vn2, Vn3, Vn4, Vn[N−1] which DC input voltages the intermediate node in question is temporarily connected to by the one or more of the 2*(N−1) modulated control signals during operation of the first output driver 240. The drain node Vn1 of the innermost power transistor Q0 of the lower leg is, for example, temporarily coupled to Vdc1 for 3-level modulation and Vdc1 is preferably a mid-supply DC voltage with a DC voltage level at one-half of the first DC input voltage Pvdd, assuming that the second DC input voltage is ground potential as illustrated. As the value of N increases, the number of different DC input voltages to which the drain node Vn1 of the innermost power transistor Q0 is temporarily connected increases linearly such that the drain node Vn1 is temporarily and selectively connected to Vdc1, Vdc2, Vdc3 and Vdc4 in the case where N=6. Each of the intermediate nodes Vp1, Vp2, Vp3, Vp4, Vp[N−1] of the upper leg of the first output driver 240 is driven in opposite phase/inverted to the corresponding node Vn1, Vn2, Vn3, Vn4, Vn[N−1] of the lower leg.

Figure 3:
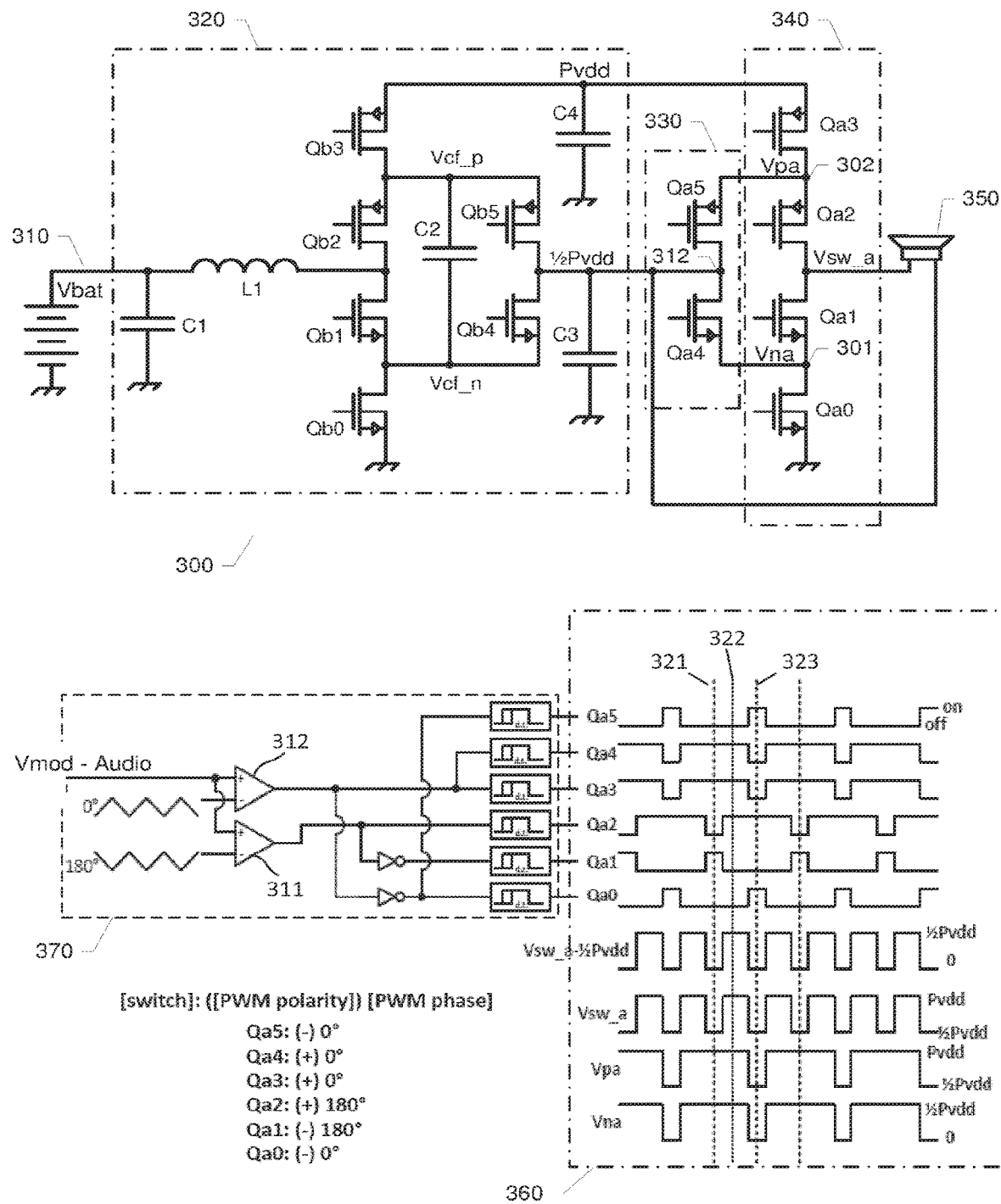
FIG. 3 shows a simplified block diagram of a 3-level single-ended class D audio power amplifier in accordance with a first embodiment of the invention.

FIG. 3 shows a simplified block diagram of a 3-level single-ended class D audio power amplifier 300 in accordance with a first embodiment of the invention. The 3-level single-ended class D audio power amplifier 300 comprises an optional dual output boost DC-DC power converter 320. The dual output DC-DC power converter 320 is configured for generating a first DC output voltage at a positive DC supply rail, Pvdd, for an output driver 340. The dual-output DC-DC power converter 320 is further configured for generating a second DC output voltage, ½Pvdd, which is applied to a single DC input voltage node 312 of a switching matrix 330 of the single-ended class D audio power amplifier 300. The level of the second DC output voltage, ½Pvdd, may be approximately one-half of the level of the positive DC supply rail, Pvdd. A first smoothing capacitor C4 is preferably coupled to the positive DC supply rail, Pvdd, and a second smoothing capacitor C3 is preferably coupled to ½Pvdd. The output driver 340 comprises four controllable semiconductor switches, or abbreviated SCSs, Qa0, Qa1, Qa2 and Qa3 coupled in series between the positive DC supply rail, Pvdd, and a negative DC supply rail which is ground potential in the present embodiment of the single ended class D audio power amplifier 300. A first leg of the output driver 340 comprises a first controllable SCS, Qa0, having a first end, e.g., a source terminal, connected to the ground potential and having a second end, e.g., a drain terminal, connected to a first intermediate node 301 of the output driver 340, and a second controllable SCS Qa1 having a first end connected to the first intermediate node 301 and having a second end connected to a driver output node Vsw_a. The driver output node Vsw_a of the output driver is connectable to a terminal or input of a loudspeaker 350 for sound reproduction. During use of the class D audio power amplifier 300 shown in FIG. 3, the other loudspeaker terminal is connected to the mid-supply level ½Pvdd The voltage across the loudspeaker 350 is therefore Vsw_a−½Pvdd. A second leg of the output driver 340 comprises a third controllable SCS, Qa2, having a first end connected to the driver output node Vsw_a and having a second end connected to a second intermediate node 302, and a fourth controllable SCS Qa3 having a first end connected to the second intermediate node 302 and having a second end connected to the positive DC supply voltage rail Pvdd. The skilled person will understand that each of the first, second, third and fourth controllable semiconductor switches of the output driver 340 may comprises a MOSFET power transistor such as a PMOS, NMOS or LDMOS power transistor.

The switching matrix 330 comprises a single switch input coupled to the single DC input voltage node 312 and two controllable semiconductor switches in the form of a fifth SCS Qa4 and a sixth SCS Qa5. A first end, e.g., a drain terminal, of the fifth SCS Qa4 is connected to the first intermediate node 301 of the output driver 340 and a second end of Qa4 is connected to the switch input at node 312 for receipt of the mid-supply level ½Pvdd. The sixth SCS Qa5 has a first end connected to the switch input and a second end connected to the second intermediate node 302 of the output driver 340. Each of the six controllable SCSs Qa0-Qa5 has a control terminal, for example a gate terminal, for switching the SCS in question between a conducting/on state and a non-conducting/off state in accordance with a suitable control signal. In operation, the dual output DC-DC power converter 320 generates the first and second DC output voltages Pvdd and ½Pvdd for powering the output driver 340 and the switching matrix 330, and thus supplies equally spaced DC voltages to the latter circuits. The dual output DC-DC power converter 320 may be powered from any suitable power source, for example a rechargeable battery cell or battery pack (Vbat) at power input 310. In order to produce an amplified audio signal at the driver output node Vsw_a, the SCS control terminals of the six controllable SCSs Qa0-Qa5 are driven by respective modulated control signals, for instance as shown in waveform plot 360. The modulated control signals are generated by a control circuit 370 which, inter alia, comprises a multi-phase PWM modulator. The input audio signal Vmod is applied to respective non-inverting inputs of two comparators 311, 312. The respective inverting inputs of the two comparators 311, 312 receive complementary triangular waveform signals, i.e., waveforms of opposite polarity. The resulting waveforms of the modulated control signals Qa0-Qa5 provided to the respective control terminals of SCSs Qa0-Qa3 of the output driver 340 and SCSs Qa4-Qa5 of the switching matrix 330 are all depicted in the waveform plot 360. The waveform plot 360 furthermore shows the resulting voltage at the driver output node Vsw_a, the resulting voltage Vsw_a−½Pvdd across the loudspeaker 350, the resulting voltage Vpa at the second intermediate node 302 and the resulting voltage Vna at the first intermediate node 301—all reflecting operation of the control circuit 370.

Hence, the modulated control signals for Qa4-Qa5 have opposite polarity and substantially 0 degrees phase shift while the modulated control signals for SCSs Qa3-Qa4 have the same polarity and substantially 0 degrees phase shift. The modulated control signals for Qa1-Qa2 have opposite polarity and 180 degrees phase shift.

Therefore, the second DC output voltage, ½Pvdd, applied to the switch input 312 of the switching matrix 330 is sequentially connected to the first intermediate node 301 and the second intermediate node 302. The second DC output voltage ½Pvdd is connected to the first intermediate node 301 through an on-resistance of Qa4 when Qa4 is conducting and Qa5 is non-conducting. Likewise, the second DC output voltage ½Pvdd is connected to the second intermediate node 302 through an on-resistance of Qa5 when Qa5 is conducting and Qa4 is non-conducting. The opposite polarity of the modulated control signals of Qa4-Qa5 ensures that only one of these SCSs is conducting at any given time. The control circuit 370 is preferably configured to sequentially place the output driver 340 in at least three different states or configurations as 321, 322 and 323, respectively, as indicated on the waveform plot 360 of FIG. 3.

In the first state 321, Qa0, Qa2 and Qa5 are non-conducting while Qa1, Qa3 and Qa4 are conducting—where the respective waveforms indicate the logic level of the modulated control signal in question at the control terminal of the associated controllable semiconductor switch. In the second state 322, Qa0, Qa1 and Qa5 are non-conducting while Qa2, Qa3, and Qa4 are conducting. In a third state or configuration 323, Qa1, Qa3 and Qa4 are non-conducting while Qa0, Qa2 and Qa5 are conducting. The control circuit 370 is preferably configured to, during at least a period of operation of the output driver 340, sequentially switch the output driver between these three states 321, 322, 323 as follows: first state 321→second state 322→third state 323→second state 322→first state 321.

Figure 4:
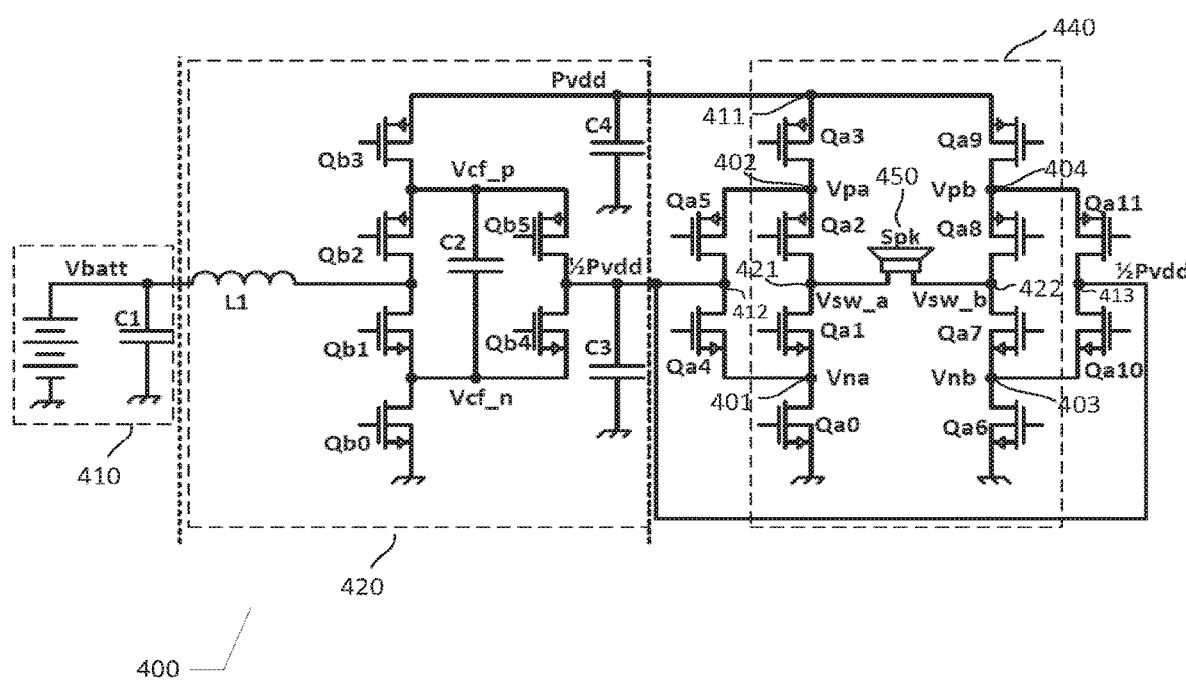
FIG. 4 shows a simplified block diagram of a 3-level class D audio power amplifier with an H-bridge, or differential, output in accordance with a second embodiment of the invention.

FIG. 4 shows a simplified block diagram of a 3-level class D audio power amplifier 400 with an H-bridge, or differential/BTL, output driver topology in accordance with a second embodiment of the invention. The 3-level class D audio power amplifier 400 comprises an optional dual output boost DC-DC power converter 420. The dual output DC-DC power converter 420 may be substantially identical to the dual output DC-DC power converter 320 described above in connection with the first embodiment of the invention. Likewise, the power source 410 of the dual output boost DC-DC power converter 420 may be identical to the previously discussed power source 310. The output driver 440 comprises two separate driver circuits, configured in a so-called H-bridge or BTL topology, with associated switching matrices in contrast to the previously discussed output driver 340 and switching matrix 330. A first driver section of the output driver 440 comprises four controllable semiconductor switches Qa0, Qa1, Qa2 and Qa3 coupled in series between the positive DC supply rail, Pvdd, and the negative DC supply rail, which is ground potential in the present embodiment. The switching matrix comprises controllable SCSs Qa4 and Qa5. The skilled person will appreciate that the characteristics of the components and operation of the first driver section and the associated switching matrix of the present class D audio power amplifier 400 may be identical to those of the output driver 340 and switching matrix 330 of the first embodiment of the invention discussed above. In particular, the waveforms of the modulated control signals Qa0-Qa5 provided to the respective control terminals of SCSs Qa0-Qa3 of the output driver 440 and SCSs Qa4-Qa5 of the switching matrix may be identical to the corresponding waveforms depicted on the waveform plot 360. The modulated control signals may be generated by a control circuit (not shown) similar to the control circuit 370 of the first embodiment albeit with certain additional logic circuitry for the H-bridge output driver 440 as discussed below. The output driver 440 comprises, in contrast to the first output driver 340, a second driver section comprising four controllable semiconductor switches Qa6, Qa7, Qa8 and Qa9 coupled in series between the positive DC supply rail, Pvdd, and the negative DC supply rail, ground. A second switching matrix comprises controllable SCSs Qa10 and Qa11. The first and second switching matrices may of course be viewed as a single larger switching matrix of the 3-level class D audio power amplifier 400. The first and second driver sections of the output driver 440 are preferably substantially identical. The first driver section comprises first and second intermediate nodes 401, 402 and the second driver section comprises third and fourth intermediate nodes 403, 404.

The output driver 440 comprises a first driver output node Vsw_a at the interconnecting node 421 between Qa1 and Qa2 of the first driver section and a second driver output node Vsw_b at the interconnecting node 422 between Qa7 and Qa8 of the second driver section. The first and second driver output nodes Vsw_a, Vsw_b are connectable to a pair of loudspeaker terminals of a loudspeaker 450 for sound reproduction in accordance with an audio signal component of the differential and modulated drive voltage across the first and second driver output nodes Vsw_a, Vsw_b.

The multi-phase PWM modulator is configured to generate or derive modulated controls for the second driver section that are phase inverted relative to the corresponding modulated control signals Qa0-Qa5 depicted on the waveform plot 360. Consequently, the modulated control signal applied to a gate terminal of Qa6 is phase inverted, or opposite polarity, relative to the modulated control signal Qa0, and the modulated control signal applied to a gate terminal of Qa7 is phase inverted relative to the modulated control signal Qa1 on the waveform plot 360 and so forth. Therefore, the output voltages at the first and second driver output nodes Vsw_a, Vsw_b are phase inverted and provide a doubling of a drive voltage across the loudspeaker 450 compared to the drive voltage generated by the single-ended class D audio power amplifier 300 discussed above.

Figure 4A:
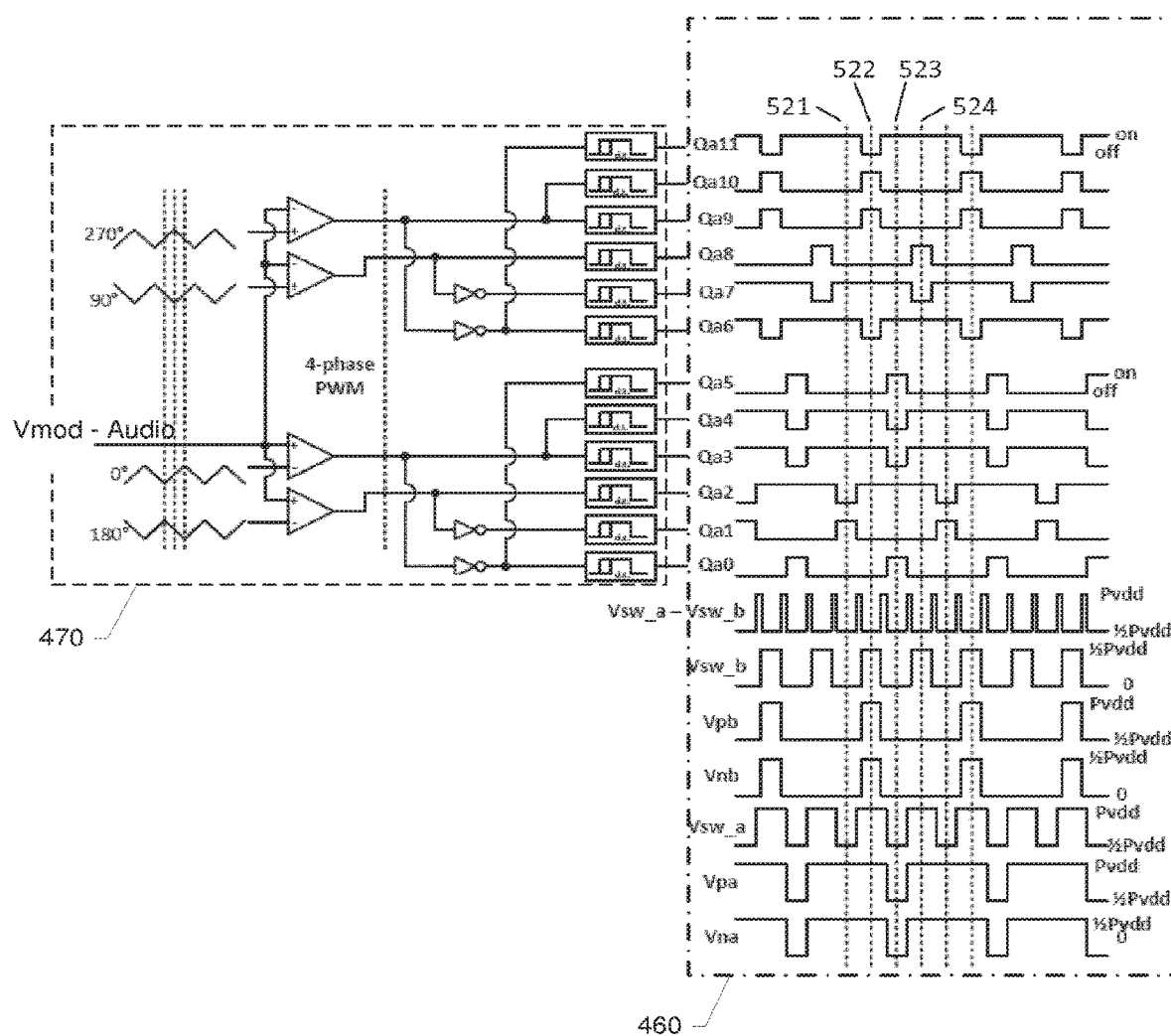
FIG. 4A shows an exemplary 4 phase PWM modulator and PWM modulated control signals for use in 4-level class D audio power amplifiers based on an H-bridge output stage.

In yet another embodiment, schematically illustrated in connection with FIG. 4A, a control circuit 470 which comprises a four phase PWM modulator is configured to generate or derive PWM modulated controls for Qa6-Qa11 of the second driver section that are phase inverted and phase shifted with substantially 90 degrees relative to the corresponding modulated control signals for Qa0-Qa5 depicted on the waveform plot 360 to provide a PWM drive signal across the first and second driver output nodes Vsw_a, Vsw_b that comprises 5 different voltage levels rather than 3 different voltage levels provided by the phase inverted characteristic of the modulated controls for the first and second driver sections.

Table 1 below lists the relative phases and polarities of the modulated controls for SCSs Qa0-Qa11. In Table 1 and Table 2 below, a (+) in the "Polarity" column refers to a non-inverted modulated control signal and a (−) in the "Polarity" column refers to an inverted modulated control signal relative to (+). Hence, the modulated control signals for, e.g., Qa0 and Qa3 are inverted or complementary, and the modulated control signals for, e.g., Qa1 and Qa2 are inverted or complementary.

The resulting waveforms of the PWM modulated control signals Qa0-Qa11 provided to the respective control terminals of SCSs Qa0-Qa11 of the H-bridge output driver and the switching matrices are all depicted in the waveform plot 460. The waveform plot 460 furthermore shows the resulting drive voltage across the driver output.

TABLE 1

| Semiconductor switch No. | Polarity | Phase |
|---|---|---|
| Qa0 | (−) | 0° |
| Qa1 | (−) | 180° |
| Qa2 | (+) | 180° |
| Qa3 | (+) | 0° |
| Qa4 | (+) | 0° |
| Qa5 | (−) | 0° |
| Qa6 | (+) | 270° |
| Qa7 | (+) | 90° |
| Qa8 | (−) | 90° |
| Qa9 | (−) | 270° |
| Qa10 | (−) | 90° |
| Qa11 | (+) | 90° |

The control circuit 470 may be configured to, during at least a period of operation of the output driver 440, sequentially switch the output driver between the four configurations or states 521, 522, 523, 524 indicated on the waveform plot 460 as follows: first configuration 521→second configuration 522→third configuration 523→fourth configuration 524→first configuration 521.

Figure 5:
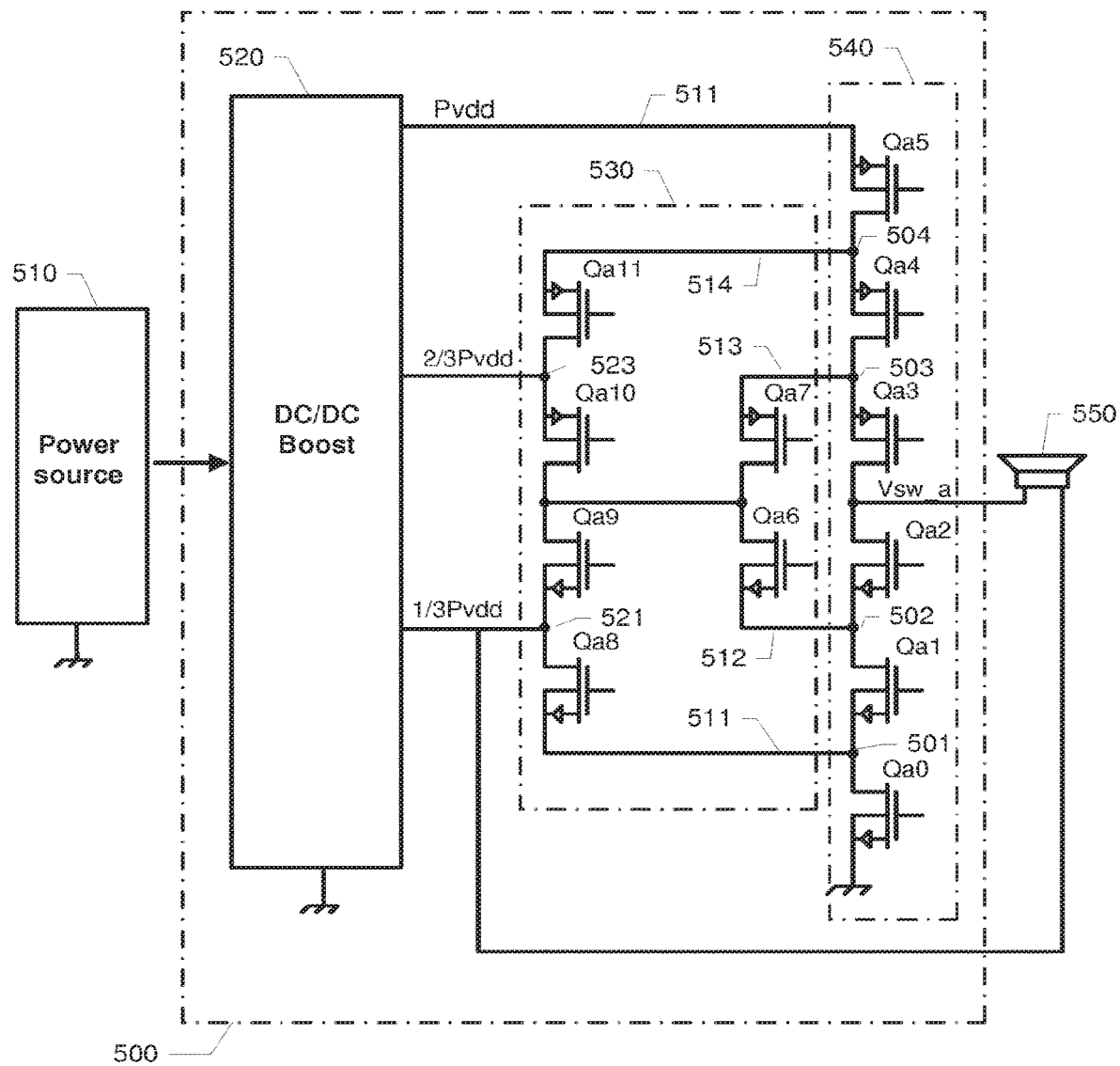
FIG. 5 shows a simplified block diagram of a 4-level class D audio power amplifier with single-ended output in accordance with a third embodiment of the invention.

FIG. 5 shows a simplified block diagram of a 4-level single-ended class D audio power amplifier 500 in accordance with a third embodiment of the invention. Hence, N=4. The 4-level single-ended class D audio power amplifier 500 may comprise a multiple-output boost DC-DC power converter 520. The multiple-output boost DC-DC power converter 520 is configured for generating a first DC output voltage for a positive DC supply rail, Pvdd, of a single-ended output driver 540 of the class D audio power amplifier 500. The multiple-output boost DC-DC power converter 520 is further configured for generating a second DC output voltage, ⅔Pvdd, which is applied to a first switch input 523 of a switching matrix 530 of the class D audio power amplifier 500. The voltage level or magnitude of the second DC output voltage, ⅔Pvdd, may be approximately two-thirds of the level of the positive DC supply rail, Pvdd. The multiple-output boost DC-DC power converter 520 further generates a third DC output voltage, ⅓Pvdd, which is applied to a second switch input 521 of the switching matrix. The voltage level or magnitude of the third DC output voltage, ⅓Pvdd, may be approximately one-third of the level of the positive DC supply rail, Pvdd. The multiple output DC-DC power converter 520 may comprise one of the multiple output DC-DC power converter circuits disclosed in the applicant's co-pending European patent application No. 14187490.9.

The single-ended output driver 540 comprises six controllable SCSs Qa0, Qa1, Qa2, Qa3, Qa4, and Qa5 coupled or connected in series/cascade between the positive DC supply rail, Pvdd, and a negative DC supply rail, which is ground potential in the present embodiment of the class D audio power amplifier 500. The single-ended output driver 540 comprises intermediate nodes 501, 502, 503, 504. A first leg of the output driver 540 comprises Qa0, Qa1 and Qa2 which each may comprise a NMOS or LDMOS transistor. A drain terminal of Qa2 is connected to a driver output node Vsw_a. A second leg of the output driver 540 comprises Qa3, Qa4, Qa5, which each may comprise a PMOS or LDMOS transistor. A drain terminal of Qa3 is connected to the driver output node Vsw_a. The driver output node Vsw_a is connectable to a terminal or input of a loudspeaker 550 for sound reproduction. During use of the class D audio power amplifier 500, another loudspeaker terminal may be connected to the second DC output voltage ⅓Pvdd. The drive voltage across the loudspeaker 550 is therefore Vsw_a–⅓Pvdd. A second leg of the output driver 540 comprises Qa3, Qa4 and Qa5, where Qa3 has a first end or drain terminal connected to the driver output node Vsw_a. A second end of Qa3 is connected to Qa4 at the third intermediate node 503. Qa5 has a source terminal connected to the positive DC supply rail, Pvdd, and a drain terminal connected to a source of Qa4 at the fourth intermediate node 504. The skilled person will understand that each of the first to sixth controllable semiconductor switches of the output driver 540 may comprises a MOSFET power transistor such as a PMOS, NMOS or LDMOS power transistor.

The switching matrix 530 comprises the previously discussed first and second switch inputs 523, 521 coupled to respective ones of the second and third DC output voltages of the boost DC-DC converter 520. The switching matrix 530 furthermore comprises at least four switch outputs 511, 512, 513, 514 connected to the respective intermediate nodes 501, 502, 503, 504 of the output driver 540. The switching matrix 530 comprises six controllable semiconductor switches in the present embodiment in form of Qa6, Qa7, Qa8, Qa9, Qa10 and Qa11. Each of the eleven controllable SCSs Qa0-Qa11 has a control terminal, such as a gate terminal, for switching the SCS in question between a conducting/on state and a non-conducting/off state in accordance with a suitable modulated control signal, for example, a PWM modulated control signal as discussed previously. In operation, the multiple-output DC-DC power converter 520 generates the first, second and third DC output voltages Pvdd, ⅔Pvdd and ⅓Pvdd for powering the output driver 540 and the switching matrix 530 and thus supplies a set of equally spaced DC voltages to the latter circuits. The dual output DC-DC power converter 520 may be powered from any suitable power source, for example, a rechargeable battery cell or battery pack (Vbat) 510. In order to produce an amplified audio signal at the driver output node Vsw_a, the SCS control terminals of the six controllable SCSs Qa0-Qa5 are driven by respective modulated control signals as discussed before in connection with the second embodiment of the invention and with the corresponding waveform plot 360. During operation, the switching matrix 530 sequentially connects the second intermediate node 502 to the second and third DC output voltages ⅔Pvdd and ⅓Pvdd and sequentially connects the third intermediate node 503 to the second and third DC output voltages ⅔Pvdd and ⅓Pvdd by applying appropriate signal levels to the control terminals of SCSs Qa6, Qa7, Qa8, Qa9, Qa10 and Qa11 of the switching matrix 530. The skilled person will appreciate that the second intermediate node 502 may be connected to the second DC output voltage ⅔Pvdd by switching, e.g., Qa6 and Qa10 to their conducting states and simultaneously switching, e.g., Qa7, Qa8, Qa9 and Qa11 to their non-conducting states. In addition, the second intermediate node 502 may be connected to the third DC output voltage ⅓Pvdd by switching, e.g., Qa6 and Qa9 to their conducting states, and simultaneously switching, e.g., Qa7, Qa8, Qa10 and Qa11 to their non-conducting states. The skilled person will appreciate that the third intermediate node 503 may be connected sequentially to the second DC output voltage ⅔Pvdd and the third DC output voltage ⅓Pvdd by selecting appropriate states or configurations of SCSs Qa6, Qa7, Qa8, Qa9, Qa10 and Qa11 of the switching matrix 530. Furthermore, following the general state switching rules for 4-level output drivers (N=4) devised by table 260 of FIG. 2, the skilled person will appreciate that the first intermediate node 501 may be selectively connected to only the third DC output voltage ⅓Pvdd and the same feature applies for the fourth intermediate node 504.

The modulated control signals for the SCSs Qa0-Qa11 of the present 4-level single-ended class D audio power amplifier 500 may be generated by a suitably configured multi-phase PWM modulator (not shown) following the previously discussed design principles for the control circuits 370, 470. Table 2 below lists the relative phases and polarities of the modulated control signals generated by the multi-phase PWM modulator and applied to the control terminals of SCSs Qa0-Qa5 of the single-ended output driver or stage 540 and the control terminals of the SCSs Qa6-Qa11 of the switching matrix 530.

TABLE 2

| Semiconductor switch No. | Polarity | Phase |
|---|---|---|
| Qa0 | (−) | 0° |
| Qa1 | (−) | 120° |
| Qa2 | (−) | 240° |
| Qa3 | (+) | 240° |
| Qa4 | (+) | 120° |
| Qa5 | (+) | 0° |
| Qa6 | (+) | 120° |
| Qa7 | (−) | 120° |
| Qa8 | (+) | 0° |
| Qa9 | (−) | 0° |
| Qa10 | (+) | 0° |
| Qa11 | (−) | 0° |

Figure 6:
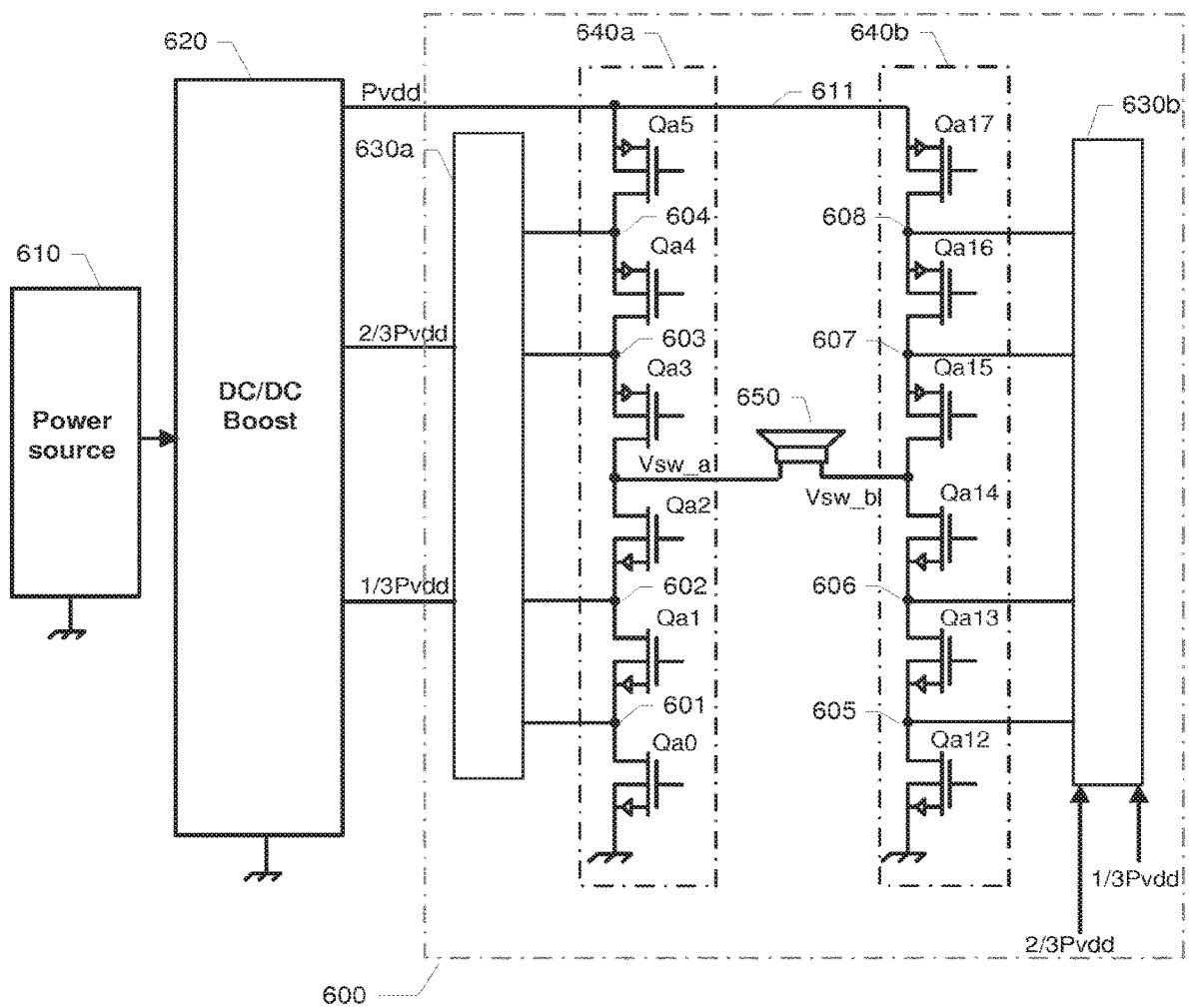
FIG. 6 shows a simplified block diagram of a 4-level class D audio power amplifier with an H-bridge, or differential, output in accordance with a fourth embodiment of the invention.

FIG. 6 shows a simplified block diagram of a 4-level class D audio power amplifier 600 with an H-bridge, or differential/BTL, output driver topology in accordance with a fourth embodiment of the invention. The 4-level class D audio power amplifier 600 comprises an optional triple output boost DC-DC power converter 620. The triple output DC- DC power converter 620 may be substantially identical to the triple output DC-DC power converter 520 described above in connection with the third embodiment of the invention. Likewise, the power source 610 may be identical to the previously discussed power sources 310, 510. The output driver comprises two separate driver circuits 640a, 640b, configured in a so-called H-bridge or BTL topology, with associated switching matrices 630a, 630b. The first driver section 640a comprises six controllable semiconductor switches Qa0-Qa5 coupled in series between a positive DC supply rail, Pvdd, and a negative DC supply rail, which is ground potential in the present embodiment. The switching matrix 630a may be identical to the previously discussed switching matrix 530 of the third embodiment of the invention. The skilled person will appreciate that the characteristics of the components and operation of the first driver section 640a and the associated switching matrix 630a of the present 4-level class D audio power amplifier 600 may be identical to those of the output driver 540 and switching matrix 530 of the third embodiment of the invention discussed above. In particular, the waveforms of the modulated control signals Qa0-Qa5 provided to the respective control terminals of SCSs Qa0-Qa5 of the output driver 540 and SCSs Qa6-Qa11 of the switching matrix may be identical to the corresponding waveforms listed in Table 2. The modulated control signals may be generated by a suitable multi-phase PWM modulator (not shown). The output driver comprises the second driver section 640b comprising six controllable semiconductor switches Qa12-Qa17 coupled in series between the positive DC supply rail, Pvdd, and the negative DC supply rail, ground. The second switching matrix 630b controls the sequence in which the second and third DC output voltages ⅔Pvdd and ⅓Pvdd are coupled to the first, second, third and fourth intermediate nodes 605, 606, 607, 608 of the second driver section 640b. The first switching matrix 630a likewise controls the sequence in which the second and third DC output voltages ⅔Pvdd and ⅓Pvdd are coupled to the first, second, third and fourth intermediate nodes 601, 602, 603, 604 of the first driver section 640a. The first and second switching matrices 630a, 630b may, of course, be viewed as a single larger switching matrix of the 4-level class D audio power amplifier 600. The first and second driver sections 640a, 640b of the output driver are preferably substantially identical.

The output driver comprises a first driver output node Vsw_a at the interconnecting node between Qa2 and Qa3 of the first driver section 640a, and a second driver output node Vsw_b at the interconnecting node between Qa14 and Qa15 of the second driver section 640b. The first and second driver output nodes Vsw_a, Vsw_b are connectable to a pair of loudspeaker terminals of a loudspeaker 650 for sound reproduction in accordance with an audio signal component of the differential and modulated drive voltage across the first and second driver output nodes Vsw_a, Vsw_b.

The multi-phase PWM modulator (not shown) is configured to generate or derive modulated control signals for the second driver section 640b and the second switching matrix 630b that are phase inverted and phase shifted substantially 60 degrees relative to the corresponding modulated control signals Qa0-Qa11 listed in Table 1 above. The relative phases and polarities of the modulated control signals generated by the multi-phase PWM modulator are therefore as follows, using the same symbol convention as Table 1 and Table 2:
Qa11: (−) 0°
Qa10: (+) 0°
Qa9: (−) 0°
Qa8: (+) 0°
Qa7: (−) 120°
Qa6: (+) 120°
Qa5: (+) 0°
Qa4: (+) 120°
Qa3: (+) 240°
Qa2: (−) 240°
Qa1: (−) 120°
Qa0: (−) 0°
Qa23: (+) 300°
Qa22: (−) 300°
Qa21: (+) 300°
Qa20: (−) 300°
Qa19: (+) 60°
Qa18: (−) 60°
Qa17: (−) 300°
Qa16: (−) 60°
Qa15: (−) 180°
Qa14: (+) 180°
Qa13: (+) 60°
Qa12: (+) 300°
where the first switching matrix 630a comprises SCSs Qa6-Qa11 and the second switching matrix 630b comprises SCSs Qa18-Qa23.

Figure 7:
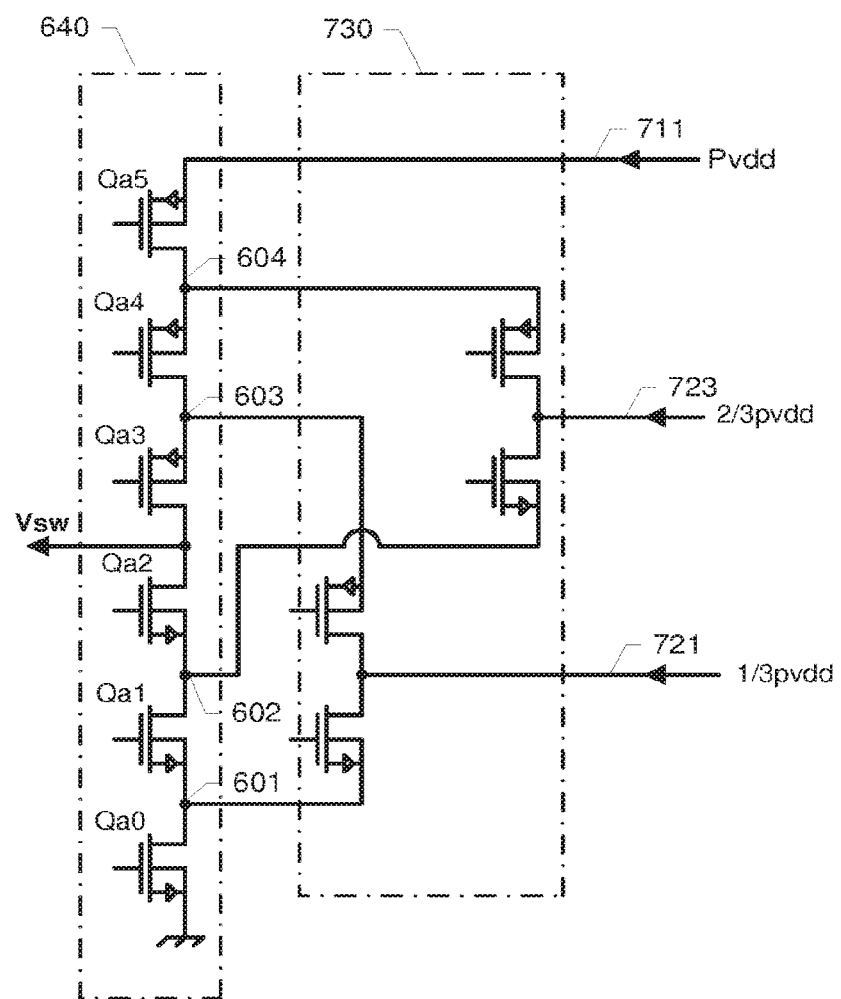
FIG. 7 shows an alternative switch matrix for use in 4-level class D audio power amplifiers with single-ended or H-bridge output drives.

FIG. 7 shows a switching matrix 730 with an alternative topology and its coupling to the first driver section 640a or to the second driver section 640b of the output driver of the 4-level class D audio power amplifier 600 discussed above.

Figure 8:
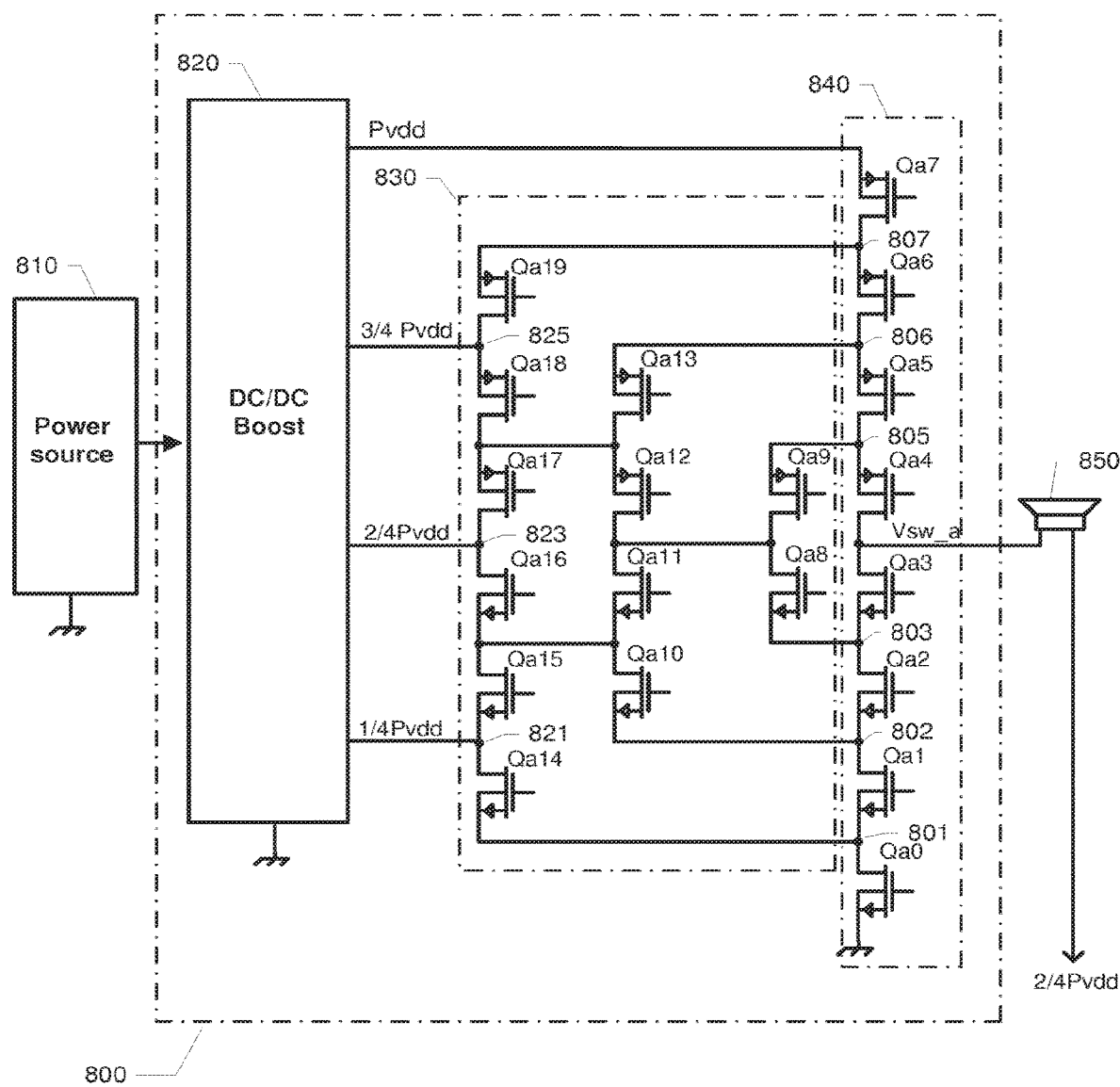
FIG. 8 shows a simplified schematic circuit diagram of a 5-level class D audio power amplifier with single-ended output in accordance with a fifth embodiment of the invention.

FIG. 8 shows a simplified block diagram of a 5-level single-ended class D audio power amplifier 800 in accordance with a fifth embodiment of the invention. Hence, N=5. The 5-level single-ended class D audio power amplifier 800 may comprise a multiple-output boost DC-DC power converter 820. The multiple-output boost DC-DC power converter 820 is configured for generating a first DC output voltage for a positive DC supply rail, Pvdd, of a single-ended output driver 840 of the class D audio power amplifier 800. The multiple-output boost DC-DC power converter 820 is further configured for generating a second DC output voltage, ¾Pvdd, which is applied to a first switch input 825 of a switching matrix 830 of the class D audio power amplifier 800. The voltage level or magnitude of the second DC output voltage, ¾Pvdd, may be approximately three-fourths of the level of the positive DC supply rail, Pvdd. The multiple-output boost DC-DC power converter 820 further generates a third DC output voltage, ½Pvdd, which is applied to a second switch input 823 of the switching matrix 830 and generates a fourth DC output voltage, ¼Pvdd, which is applied to a third switch input 821 of the switching matrix 830. The voltage level or magnitude of the third DC output voltage, ½Pvdd, may be approximately one-half of the level of the positive DC supply rail, Pvdd and the fourth DC output voltage, ¼Pvdd, may be approximately one-quarter of the level of the positive DC supply rail, Pvdd. The multiple output DC-DC power converter 820 may comprise one of the multiple output DC-DC power converter circuits disclosed in the applicant's co-pending European patent application No. 14187490.9. The switching matrix 830 comprises SCSs Qa8-Qa19. The single-ended output driver 840 comprises at least eight controllable SCSs Qa0, Qa1, Qa2, Qa3, Qa4, Qa5, Qa6, and Qa7 coupled or connected in series/cascade between the positive DC supply rail, Pvdd, and a negative DC supply rail which is ground potential in the present embodiment of the class D audio power amplifier 800. The single-ended output driver 840 furthermore comprises intermediate nodes 801, 802, 803, 805, 806 and 807. Each of Qa0-Qa3 may comprise a NMOS or LDMOS transistor. A drain terminal of Qa3 is connected to a driver output node Vsw_a. Each of Qa4-Qa7 may comprise a PMOS or LDMOS transistor. A drain terminal of Qa4 is connected to the driver output node Vsw_a. The driver output node Vsw_a is connectable to a terminal or input of a loudspeaker 850 for sound reproduction. During use of the class D audio power amplifier 800, another loudspeaker terminal may be connected to the third DC output voltage ½Pvdd. The drive voltage across the loudspeaker 850 is therefore Vsw_a–½Pvdd. The skilled person will understand that each of the first to eighth controllable semiconductor switches of the output driver 840 may comprise a MOSFET power transistor such as a PMOS, NMOS or LDMOS power transistor.

The switching matrix 830 comprises at least six switch outputs connected to respective ones of the six intermediate nodes 801-803, 805-807. Each of the 19 controllable SCSs Qa0-Qa19 has a control terminal, for example a gate terminal, for switching the SCS in question between a conducting/on state and a non-conducting/off state in accordance with a suitable modulated control signal, for example, a PWM modulated control signal as discussed previously. The multiple output DC-DC power converter 820 may be powered by any suitable power/energy source, for example, a rechargeable battery cell or a battery pack 810. In order to produce an amplified audio signal at the driver output node Vsw_a, the control terminals of the eight controllable SCSs Qa0-Qa7 are driven by respective modulated control signals as discussed before in connection with the third embodiment of the invention and with the corresponding waveform plot 360. During operation, the switching matrix 830 sequentially connects intermediate nodes 801-803, 805-807 to one or more of the second, third and fourth DC output voltages following the general state switching rules for 5-level output drivers (N=5) devised by table 260 of FIG. 2.

The modulated control signals for the SCSs Qa0-Qa19 of the present 5-level single-ended class D audio power amplifier 800 may be generated by a suitably configured multi-phase PWM modulator (not shown) following the previously discussed design principles for the control circuits 370, 470. The relative phases and polarities of the modulated control signals generated by the multi-phase PWM modulator and applied to the control terminals of SCSs Qa0-Qa7 of the single-ended output driver or stage 840 and the control terminals of the SCSs Qa8-Qa19 of the switching matrix 830 may be as follows using the same symbol convention as Table 1 and Table 2:

Qa19: (−) 0°
Qa18: (+) 0°
Qa17: (−) 0°
Qa16: (+) 0°
Qa15: (−) 0°
Qa14: (+) 0°
Qa13: (−) 0°
Qa12: (+) 90°
Qa11: (−) 90°
Qa10: (+) 90°
Qa9: (−) 180°
Qa8: (+) 180°
Qa7: (+) 0°
Qa6: (+) 90°
Qa5: (+) 180°
Qa4: (+) 270°
Qa3: (−) 270°
Qa2: (−) 180°
Qa1: (−) 90°
Qa0: (−) 0°

Furthermore, a 5-level H-bridge variant of the single-ended class D audio power amplifier 800 may comprise a second driver section that is identical to the first driver section 840 and a second switching matrix that is identical to the switching matrix 830. In the latter case, the second driver section may comprise controllable SCSs Qa20-Qa27 and the second switching matrix comprises controllable SCSs Qa28-Qa39. The relative phase shifts and polarities of the modulated control signals generated by the multi-phase PWM modulator and applied to the control terminals of SCSs Qa20-Qa39 are inverted and shifted substantially 45 degrees relative to the corresponding modulated control signals Qa0-Qa19 of the single-ended class D audio power amplifier 800 listed above. The relative phases and polarities of the modulated control signals generated by the multi-phase PWM modulator are therefore as follows:

Qa39: (+) 315°
Qa38: (−) 315°
Qa37: (+) 315°
Qa36: (−) 315°
Qa35: (+) 315°
Qa34: (−) 315°
Qa33: (+) 225°
Qa32: (−) 225°
Qa31: (+) 225°
Qa30: (−) 225°
Qa29: (+) 135°
Qa28: (−) 135°
Qa27: (−) 315°
Qa26: (−) 225°
Qa25: (−) 135°
Qa24: (−) 45°
Qa23: (+) 45°
Qa22: (+) 135°
Qa21: (+) 225°
Qa20: (+) 315°

What is claimed is:

1. A class D power amplifier for supplying a drive signal having at least three levels to a load, the class D power amplifier comprising:
a first output driver comprising:
an output terminal for providing the drive signal to the load;
a first supply terminal for connection to a first direct current (DC) voltage rail, and a second supply terminal for connection to a second DC voltage rail;
a lower leg coupled between the second supply and output terminals, and comprising first and second lower driver switches connected at a first lower intermediate node;
an upper leg coupled between the output and first supply terminals, and comprising first and second upper driver switches connected at a first upper intermediate node;
a switch matrix comprising a third supply terminal for connection to a third DC voltage rail, a first matrix switch configured to couple the third supply terminal to the first lower intermediate node, and a second matrix switch configured to couple the third supply terminal to the first upper intermediate node; and
a controller configured to generate modulated control signals that control conductivity of the driver switches of the first output driver, and to generate matrix control signals that control conductivity of the matrix switches of the switch matrix, wherein the matrix control signals are based upon the modulated control signals.

2. The class D power amplifier of claim 1, wherein the controller is configured to generate the modulated control signals based upon an input signal provided at an input terminal, and wherein the drive signal represents an amplified version of the input signal.

3. The class D power amplifier of claim 1, wherein the matrix control signals are generated so as to alternately connect the third supply terminal to the first lower intermediate node and the first upper intermediate node.

4. The class D power amplifier of claim 3, wherein the generated matrix control signals comprise a first matrix control signal that controls the first matrix switch and a second matrix control signal that controls the second matrix switch, wherein the second matrix control signal is inverted relative to the first matrix control signal, and wherein a duty cycle of the first matrix control signal is based upon an input signal provided at an input terminal.

5. The class D power amplifier of claim 4, wherein the duty cycle of the first matrix control signal is further based upon a comparison of the input signal with a triangular wave.

6. The class D power amplifier of claim 1, further comprising a DC power supply that supplies the third DC voltage rail with a third voltage that is between a first voltage of the first DC voltage rail and a second voltage of the second DC voltage rail.

7. The class D power amplifier of claim 6, wherein the DC power supply is a boost converter that is configured to supply power to the second voltage rail and the third voltage rail, wherein the second voltage is a multiple of the third voltage.

8. The class D power amplifier of claim 1, wherein the drive signal has at least four levels;
wherein the lower leg further comprises a third lower driver switch coupled to the second lower driver switch at a second lower intermediate node;
wherein the upper leg further comprises a third upper driver switch coupled to the second upper driver switch at a second upper intermediate node; and
wherein the switch matrix further comprises a fourth supply terminal for connection to a fourth DC voltage rail, and additional matrix switches such that the first, second, and additional switch matrixes are configured to switchably couple the third supply terminal to each of the second lower intermediate node, the first lower intermediate node, and the first upper intermediate node, and to switchably couple the fourth supply terminal to each of the first lower intermediate node, the first upper intermediate node, and the second upper intermediate node, according to the matrix control signals generated by the controller.

9. The class D power amplifier of claim 1, further comprising:
an additional output driver comprising:
an additional output terminal for providing the drive signal to the load, wherein the drive signal is differentially applied across the output and additional output terminals;
an additional lower leg coupled between the second supply and the additional output terminals, and comprising additional first and second lower driver switches connected at an additional first lower intermediate node;
an additional upper leg coupled between the additional output and first supply terminals, and comprising additional first and second upper driver switches connected at an additional second upper intermediate node; and
an additional switch matrix comprising an additional third supply terminal for connection to the third DC voltage rail, an additional first matrix switch configured to couple the additional third supply terminal to the additional first lower intermediate node, and an additional second matrix switch configured to couple the additional third supply terminal to the additional second upper intermediate node,
wherein the controller is further configured to generate additional modulated control signals that control conductivity of the additional driver switches of the additional output driver, and to generate additional matrix control signals that control conductivity of the matrix switches of the additional switch matrix.

10. The class D power amplifier of claim 9, wherein the additional modulated control signals are phase inverted relative to the modulated control signals.

11. The class D power amplifier of claim 1, wherein the driver switches of the first output driver and the matrix switches of the switch matrix are metal-oxide semiconductor field-effect transistor (MOSFETs).

12. The class D power amplifier of claim 1, wherein the first and second lower driver switches are n-channel metal-oxide semiconductor field-effect transistor (MOSFETs).

13. The class D power amplifier of claim 1, wherein the first and second upper driver switches are p-channel metal-oxide semiconductor field-effect transistor (MOSFETs).

14. A class D power amplifier for supplying a drive signal having at least three levels to a load, the class D power amplifier comprising:
a first output driver coupled between first and second supply terminals for connection to a first and a second direct current (DC) voltage, respectively, and having first and second intermediate nodes, and configured to switchably couple one of the first and the second intermediate nodes to an output terminal, wherein the output terminal provides the drive signal to the load;
a switch matrix comprising a third supply terminal for connection to a third DC voltage, a first matrix switch configured to couple the third supply terminal to the first intermediate node, and a second matrix switch configured to couple the third supply terminal to the second intermediate node; and
a controller configured to generate driver control signals for controlling the coupling of the intermediate nodes to the output terminal, and to generate matrix control signals that control conductivity of the matrix switches of the switch matrix, so as to alternate coupling of the third DC voltage between the first and the second intermediate node.

15. A class D power amplifier for supplying a drive signal having at least three levels to a load, the class D power amplifier comprising:
a first output driver comprising:
an output terminal for providing the drive signal to the load;
a first supply terminal for connection to a first direct current (DC) voltage rail, and a second supply terminal for connection to a second DC voltage rail;
a lower leg coupled between the second supply and output terminals, and comprising first and second lower driver switches connected at a first lower intermediate node;

an upper leg coupled between the output and first supply terminals, and comprising first and second upper driver switches connected at a first upper intermediate node;

a switch matrix comprising a third supply terminal for connection to a third DC voltage, and configured to alternately couple the third supply terminal to the first lower and the first upper intermediate nodes; and a controller configured to generate modulated control signals that control conductivity of the driver switches of the first output driver, and to generate matrix control signals that control the alternate coupling of the switch matrix.

* * * * *